United States Patent
Tokunaga et al.

(10) Patent No.: US 11,551,856 B2
(45) Date of Patent: Jan. 10, 2023

(54) COIL COMPONENT, CIRCUIT BOARD, AND ELECTRONIC DEVICE

(71) Applicant: TAIYO YUDEN CO., LTD., Tokyo (JP)

(72) Inventors: Satoshi Tokunaga, Tokyo (JP); Tomoo Kashiwa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 141 days.

(21) Appl. No.: 17/186,994

(22) Filed: Feb. 26, 2021

(65) Prior Publication Data
US 2021/0272744 A1 Sep. 2, 2021

(30) Foreign Application Priority Data

Feb. 29, 2020 (JP) .............................. JP2020-034495

(51) Int. Cl.
*H01F 27/29* (2006.01)
*H05K 1/18* (2006.01)
(Continued)

(52) U.S. Cl.
CPC .......... *H01F 27/292* (2013.01); *H01F 27/245* (2013.01); *H01F 27/2804* (2013.01); *H01F 41/0233* (2013.01); *H01F 41/043* (2013.01); *H05K 1/181* (2013.01); *H01F 2027/2809* (2013.01); *H05K 2201/1003* (2013.01)

(58) Field of Classification Search
CPC ................. H01F 17/0013; H01F 17/04; H01F 2017/048; H01F 2027/2809; H01F 27/245; H01F 27/2804; H01F 27/292; H01F 41/0233; H01F 41/043; H05K 1/181; H05K 2201/1003; H05K 3/3442
See application file for complete search history.

(56) References Cited

U.S. PATENT DOCUMENTS 6,280,858 B1 * 8/2001 Teshima ............... H05K 3/3463
428/646
2002/0017018 A1 * 2/2002 Ohkawara ........... H01F 10/3268
29/603.18
(Continued)

FOREIGN PATENT DOCUMENTS

JP 2018-101732 A 6/2018

*Primary Examiner* — Timothy J Thompson
*Assistant Examiner* — Rhadames Alonzo Miller
(74) *Attorney, Agent, or Firm* — Pillsbury Winthrop Shaw Pittman, LLP

(57) ABSTRACT

A coil component according to one or more embodiments includes a base body having first to sixth surfaces, and a coil conductor including a winding portion that extends around a coil axis intersecting the first and second surfaces. The winding portion includes first, second, third, and fourth portions facing the third, fourth, fifth, and sixth surfaces, respectively when viewed from a direction of the coil axis. The radii of curvature of the first and second portions are both smaller than the radii of curvature of the third and fourth portions. When viewed from the direction of the coil axis, the distance between the first portion and the third surface and the distance between the second portion and the fourth surface are both larger than the distance between the third portion and the fifth surface and the distance between the fourth portion and the sixth surface.

11 Claims, 8 Drawing Sheets

(51) Int. Cl.
*H01F 27/245* (2006.01)
*H01F 41/04* (2006.01)
*H01F 41/02* (2006.01)
*H01F 27/28* (2006.01)

(56) References Cited

U.S. PATENT DOCUMENTS

| | | | |
|---|---|---|---|
| 2003/0137053 A1* | 7/2003 | Okayama | H01L 21/76877 257/E21.585 |
| 2004/0219341 A1* | 11/2004 | Kataoka | H05K 3/388 428/209 |
| 2014/0145816 A1* | 5/2014 | Sato | H01F 17/0013 336/208 |
| 2015/0084729 A1* | 3/2015 | Lee | H01F 17/0013 336/192 |
| 2016/0035476 A1* | 2/2016 | Mimura | H01F 41/046 336/199 |
| 2017/0098997 A1* | 4/2017 | Hamada | H01F 1/0306 |
| 2017/0345552 A1* | 11/2017 | Nakano | H01F 27/292 |
| 2018/0075965 A1* | 3/2018 | Yoshioka | H01F 27/292 |
| 2018/0174740 A1 | 6/2018 | Muneuchi | |
| 2020/0013544 A1* | 1/2020 | Yoshioka | H01F 27/292 |
| 2020/0027645 A1* | 1/2020 | Yoshioka | H01F 27/255 |
| 2020/0335250 A1* | 10/2020 | Sukegawa | H01F 17/045 |
| 2020/0335261 A1* | 10/2020 | Sukegawa | H01F 27/006 |
| 2020/0335266 A1* | 10/2020 | Maki | H01F 41/04 |
| 2020/0373079 A1* | 11/2020 | Yoshioka | H01F 27/29 |
| 2021/0234415 A1* | 7/2021 | Taniguchi | H02K 1/187 |

\* cited by examiner

COIL COMPONENT, CIRCUIT BOARD, AND ELECTRONIC DEVICE

CROSS-REFERENCE TO RELATED APPLICATIONS

This application is based on and claims the benefit of priority from Japanese Patent Application Serial No. 2020-034495 (filed on Feb. 29, 2020), the contents of which are hereby incorporated by reference in its entirety.

TECHNICAL FIELD

The present disclosure relates to a coil component, a circuit board, and an electronic device.

BACKGROUND

Various coil components are used in electronic devices. A conventional coil component typically includes a magnetic base body formed of a magnetic material, an external electrode provided on a surface of the magnetic base body, and a coil conductor extending around a coil axis in the magnetic base body.

One example of coil components is an inductor. An inductor is a passive element used in an electronic circuit. For example, an inductor eliminates noise in a power source line or a signal line. A conventional inductor is disclosed by Japanese Patent Application Publication No. 2018-101732.

Magnetic fluxes that are generated when current running through the coil conductor changes penetrating through a region between a winding portion and end and side surfaces of the base body. If the external dimensions of the base body are made small in order to reduce the whole size of such a conventional coil component, it is not possible to secure a sufficient area for the magnetic fluxes penetrating between the coil conductor in the base body and the surface of the base body, which may degrade the inductance. Whereas if the distance between the coil conductor and the surface of the base body is increased in a uniform manner in order to improve the inductance, the external dimensions of the base body is increased, which is not desirable.

SUMMARY

One object of the invention disclosed herein is to solve or alleviate the above drawback of the conventional coil component. More specifically, one object of the invention disclosed herein is to provide a compact coil component while preventing degradation of its inductance. Other objects of the invention disclosed herein will be apparent with reference to the entire description in this specification. The invention disclosed herein may solve any other drawbacks grasped from the following description instead of or in addition to the above drawback.

A coil component according to one or more aspects of the invention includes: a base body made of a magnetic material and having a first surface that extends in a first direction and a second direction orthogonal to the first direction and has a first dimension in the first direction larger than a second dimension in the second direction, a second surface that faces the first surface, a third surface that connects an end of the first surface in the first direction and an end of the second surface in the first direction, a fourth surface that faces the third surface, a fifth surface that connects the third surface and the fourth surface, and a sixth surface that faces the fifth surface; a coil conductor including a winding portion that extends around a coil axis intersecting the first surface and the second surface; a first external electrode disposed on the base body and connected to one end of the coil conductor; and a second external electrode disposed on the base body and connected to the other end of the coil conductor. In the above coil component, when viewed from a direction of the coil axis, the winding portion includes a first portion that faces the third surface and is curved toward the third surface, a second portion that faces the fourth surface and is curved toward the fourth surface, a third portion that connects the first portion and the second portion and faces the fifth surface, and a fourth portion that connects the first portion and the second portion and faces the sixth surface. The radii of curvature of the first portion and the second portion are both smaller than the radii of curvature of the third portion and the fourth portion. When viewed from the direction of the coil axis, the distance between the first portion and the third surface and the distance between the second portion and the fourth surface are both larger than the distance between the third portion and the fifth surface and the distance between the fourth portion and the sixth surface.

In the above coil component, the distance between the first portion and the third surface and the distance between the second portion and the fourth surface may be both in a range of 1.5 to 10 times the distance between the third portion and the fifth surface and the distance between the fourth portion and the sixth surface.

In the above coil component, when viewed from the direction of the coil axis, the distance between the first portion of the winding portion and the third surface may be substantially same as the distance between the second portion of the winding portion and the fourth surface.

In the above coil component, when viewed from the direction of the coil axis, the distance between the third portion of the winding portion and the fifth surface may be substantially same as the distance between the fourth portion of the winding portion and the sixth surface.

In the above coil component, the winding portion may have a uniform cross-sectional area.

In the above coil component, the first external electrode may be connected to one end of the winding portion via a first lead-out portion extending along the coil axis.

In the above coil component, the second external electrode may be connected to the other end of the winding portion via a second lead-out portion extending along the coil axis.

In the above coil component, a proportion of an area of the winding portion to an area of the first surface when viewed from the direction of the coil axis may be 0.3 or more.

According to another aspect of the invention, the coil component is used in a DC-to-DC converter. Yet another aspect of the invention relates to a DC-to-DC converter including the above coil component.

A circuit board according to one aspect of the invention includes: the above coil component; and a mount substrate soldered to the external electrode.

An electronic device according to one embodiment of the present invention includes the above circuit board.

Advantageous Effects

As discussed above, according to the one or more aspects of the invention, it is possible to provide the coil components having a reduced size while preventing degradation of inductance.

DESCRIPTION OF THE EMBODIMENTS

Figure 1:
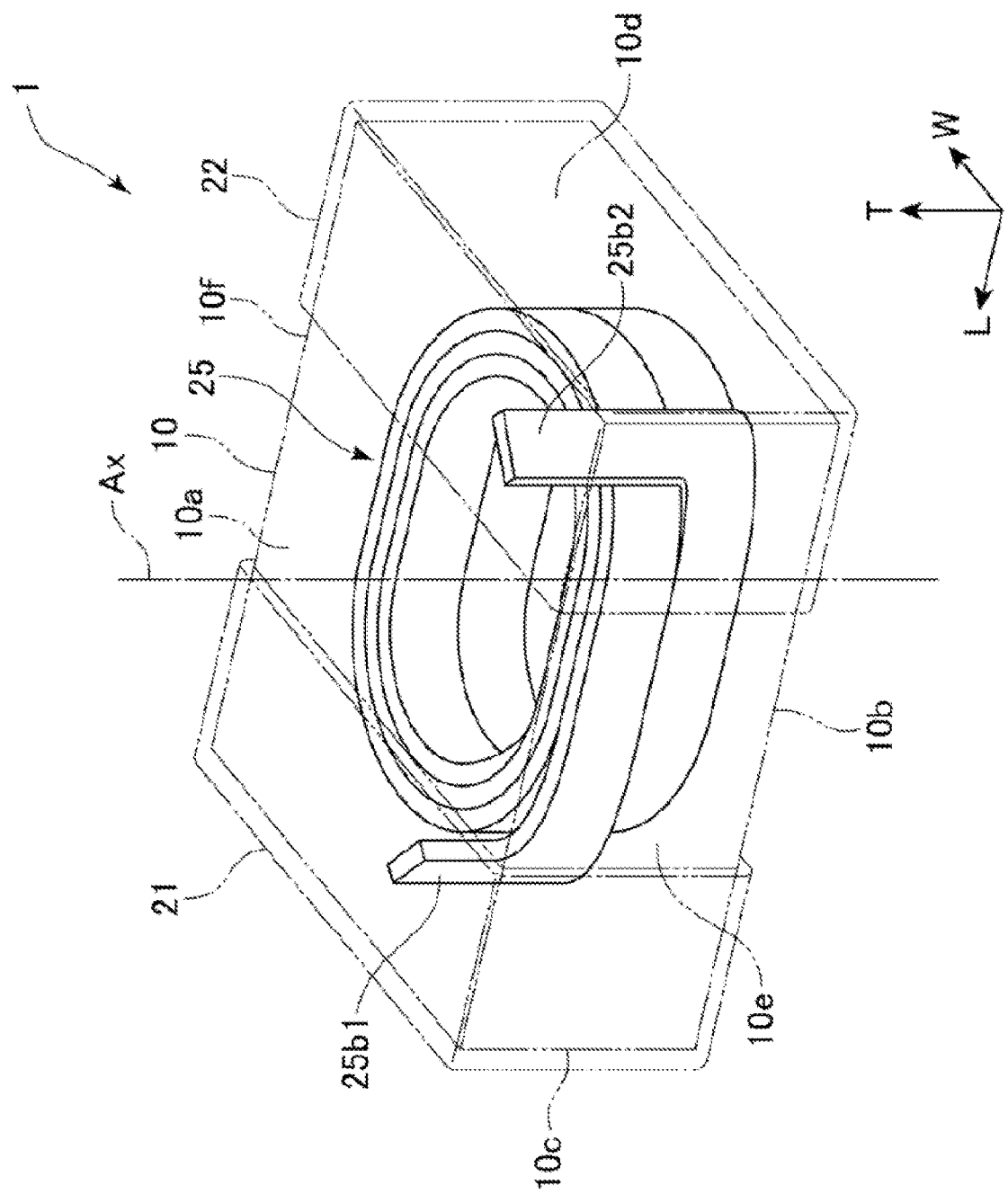
FIG. 1 is a perspective view schematically showing a coil component according to one embodiment of the invention.

Various embodiments of the present invention will be hereinafter described with reference to the accompanying drawings. Reference characters designating corresponding components are repeated as necessary throughout the drawings for the sake of consistency and clarity. For convenience of explanation, the drawings are not necessarily drawn to scale.

Figure 2:
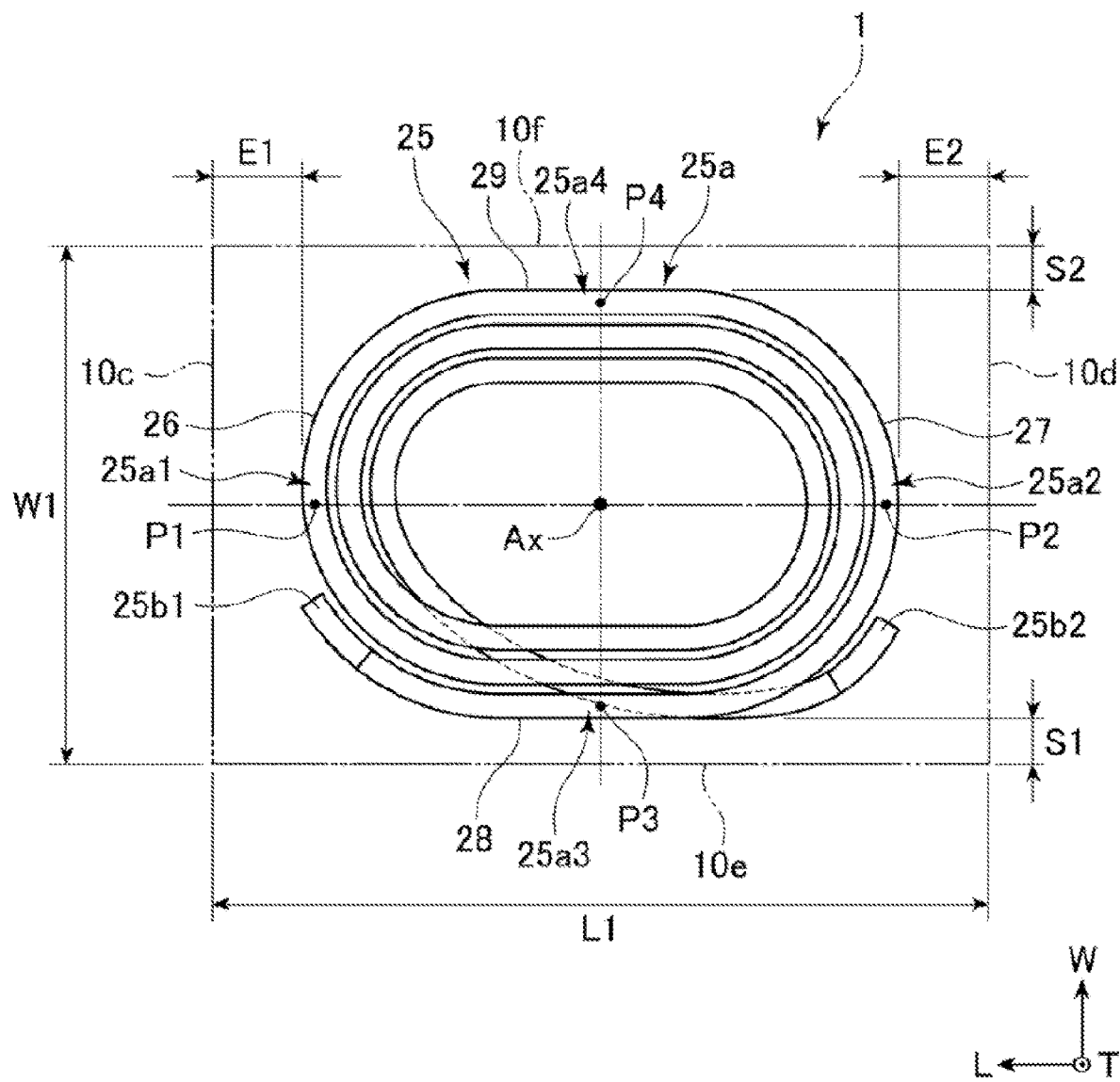
FIG. 2 is a schematic plan view of the coil component shown in FIG. 1.

A coil component 1 according to one embodiment of the invention will be hereinafter described with reference to FIGS. 1 and 2. FIG. 1 is a schematic perspective view of the coil component 1, and FIG. 2 is a schematic plan view of the coil component 1. FIG. 2 illustrates a magnetic base body 10 and a coil conductor 25 in a plan view (viewed from a coil axis Ax direction described later), the periphery of the coil component is made transparent to show them therein in FIG. 2. In the illustrated embodiment, the coil component 1 is a planar coil having a coil conductor wound several or more times in a plane. The coil component 1 includes the magnetic base body 10, the coil conductor 25 provided in the magnetic base body 10, an external electrode 21 disposed on the surface of the magnetic base body 10, and an external electrode 22 disposed on the surface of the magnetic base body 10 at a position spaced apart from the external electrode 21.

In this specification, a "length" direction, a "width" direction, and a "height" direction of the coil component 1 correspond to the "L axis" direction, the "W axis" direction, and the "T axis" direction in FIG. 1, respectively, unless otherwise construed from the context.

The coil component 1 is mounted on a mount substrate 2. A circuit board according to one embodiment includes the coil component 1 and the mount substrate on which the coil component 1 is mounted. In FIG. 1, the mount substrate is not shown. The mount substrate has two land portions and the coil component 1 is mounted on the mount substrate 2 by bonding the external electrodes 21, 22 to the corresponding land portions 3 of the mount substrate 2. The circuit board can be installed in various electronic devices. Electronic devices in which the circuit board 2 may be installed include smartphones, tablets, game consoles, electrical components of automobiles, and various other electronic devices.

The coil component 1 may be applied to inductors, transformers, filters, reactors, and various other coil components. The coil component 1 may also be applied to coupled inductors, choke coils, and various other magnetically coupled coil components. The coil component 1 may be, for example, an inductor used in a DC/DC converter. Applications of the coil component 1 are not limited to those explicitly described herein.

In one embodiment, the base body 10 is made mainly of a magnetic material and formed in a substantially rectangular parallelepiped shape. The term "rectangular parallelepiped" or "rectangular parallelepiped shape" used herein is not intended to mean solely "rectangular parallelepiped" in a mathematically strict sense. The base body 10 has a first principal surface 10a, a second principal surface 10b, a first end surface 10c, a second end surface 10d, a first side surface 10e, and a second side surface 10f. These six surfaces define the outer periphery of the base body 10. The first principal surface 10a and the second principal surface 10b are at the opposite ends in the height direction, the first end surface 10c and the second end surface 10d are at the opposite ends in the length direction, and the first side surface 10e and the second side surface 10f are at the opposite ends in the width direction. The first principal surface 10a opposes the second principal surface 10b, the first end surface 10c opposes the second end surface 10d, and the first side surface 10e opposes the second side surface 10f. The first end surface 10c connects an end of the first principal surface 10a situated in a positive direction of the L axis and an end of the second principal surface 10b in the positive direction of the L axis. The first principal surface 10a, the second principal surface 10b, the first end surface 10c, the second end surface 10d, the first side surface 10e, and the second side surface 10f are an example of a first surface, a second surface, a third surface, a fourth surface, a fifth surface, and a sixth surface, respectively described in the claims.

In one embodiment, the first principal surface 10a extends in the L axis direction and the W axis direction. In one embodiment, a dimension L1 of the first principal surface 10a in the L axis direction is larger than a dimension W1 in the W axis direction. In one embodiment, the base body 10 has a length (the dimension in the L axis direction) of 1.0 to 4.5 mm, a width (the dimension in the W axis direction) of 0.5 to 3.2 mm, and a height (the dimension in the T axis direction) of 0.5 to 5.0 mm. The dimensions of the base body 10 are not limited to those specified herein.

In one embodiment, the magnetic base body 10 is made of a composite magnetic material containing a plurality of metal magnetic particles and a binder. The metal magnetic particles may be a particle mixture obtained mixing together two or more types of metal magnetic particles having different average particle sizes. When the metal magnetic particles include large-diameter metal magnetic particles and small-diameter metal magnetic particles, the average particle size of the large-diameter metal magnetic particles is, for example, 10 μm, and the average particle size of the small-diameter metal magnetic particles is, for example, 1 μm. The binder binds the plurality of metal magnetic particles to each other. The binder is, for example, a thermosetting resin having a high insulating property. The magnetic base body 10 may be a compact in which the metal magnetic particles are bonded to each other without using the binder. The metal magnetic particles can be formed of various soft magnetic materials. For example, a main ingredient of the metal magnetic particles is Fe. Specifically, the metal magnetic particles are particles of (1) a metal such as Fe or Ni, (2) a crystalline alloy such as a Fe—Si—Cr alloy, an Fe—Si—Al alloy, or an Fe—Ni alloy, (3) an amorphous alloy such as an Fe—Si—Cr—B—C alloy or an Fe—Si—Cr—B alloy, or (4) a mixture thereof. The composition of the metal magnetic particles contained in the magnetic base body 10 is not limited to those described above. An insulating film made of glass, resin, or any other material having excellent insulating properties may be provided on the surface of each metal magnetic particle.

The coil conductor 25 includes a winding portion 25a wound around the coil axis Ax extending along the thickness direction (T-axis direction), a lead-out portion 25b1 that connects one end of the winding portion 25a to the external electrode 21, and a lead-out portion 25b2 that connects the other end of the winding portion 25a to the external electrode 22. In the illustrated embodiment, the coil axis Ax intersects the first principal surface 10a and the second principal surface 10b, but does not intersect the first end surface 10c, the second end surface 10d, the first side surface 10e, and the second side surface 10f. In other words, the first end surface 10c, the second end surface 10d, the first side surface 10e, and the second side surface 10f extend in the direction along the coil axis Ax. In one embodiment, the coil axis Ax passes through the intersection of two diagonal lines of the base body 10 when the base body 10 is viewed in plan.

In the illustrated embodiment, the winding portion 25a is wound around the coil axis Ax for a plurality of turns in a plane extending along an LW plane. In the illustrated embodiment, the winding portion 25a has a substantially oval shape. The shape of the winding portion 25a is not limited to one shown. The winding portion 25a may have, for example, an elliptical shape. In one embodiment, the winding portion 25a has a uniform cross-sectional area cut in a direction perpendicular to the direction in which the current flows.

In one embodiment, the winding portion 25a has a first portion 25a1 facing the first end surface 10c, a second portion 25a2 facing the second end surface 10d, a third portion 25a3 facing the first side surface 10e, and a fourth portion 25a4 facing the second side surface 10f in a plan view (that is, when viewed from the direction of the coil axis Ax).

In the illustrated embodiment, the first portion 25a1 in a first turn of the winding counted from the lead-out portion 25b1 extends counterclockwise from one end to the other end of the first portion, and is connected to the lead-out portion 25b1 at its one end. The third portion 25a3 in the first turn of the winding extends counterclockwise from one end to the other end of the third portion, and its one end is connected to the other end of the first portion 25a1 in the first turn. The second portion 25a2 in the first turn of the winding extends counterclockwise from one end to the other end of the second portion, and its one end is connected to the other end of the third portion 25a3 in the first turn. The fourth portion 25a4 in the first turn of the winding extends counterclockwise from one end to the other end of the fourth portion, and its one end is connected to the other end of the second portion 25a2 in the first turn. The first portion 25a1 in a second turn of the winding extends counterclockwise from one end to the other end of the first portion, and its one end is connected to the fourth portion 25a4 in the first turn. In the same manner, the winding portion 25a extends and is wound until its end is connected to the lead-out portion 25b2. The third portion 25a3 and the fourth portion 25a4 connect the first portion 25a1 and the second portion 25a2, respectively.

In one embodiment, as shown in the drawing, the first portion 25a1 has a curved surface 26 that is convexly curved toward the first end surface 10c and faces the first end surface 10c. In one embodiment, as shown in the drawing, the second portion 25a2 has a curved surface 27 that is convexly curved toward the second end surface 10d and faces the second end surface 10d. The curved surface 26 of the first portion 25a1 and the curved surface 27 of the second portion 25a2 may have the same or substantially the same radius of curvature. When a difference between the curvature radius of the curved surface 26 of the first portion 25a1 and the curvature radius of the curved surface 27 of the second portion 25a2 is 10% or less of the curvature radius of the curved surface 26 of the first portion 25a1, it can be said that the curvature radii of them are substantially the same.

In one embodiment, as shown in the drawing, the third portion 25a3 has a planar surface 28 that extends parallel to the first side surface 10e and faces the first side surface 10e. The planar surface 28 may occupy the entire or a part of the surface of the third portion 25a3 that faces the first side surface 10e. The surface of the third portion 25a3 facing the first side surface 10e may be a composite surface in which the planar surface 28 and the curved surface are connected. In one embodiment, the surface of the third portion 25a3 facing the first side surface 10e may be a curved surface that curves convexly toward the first side surface 10e.

In one embodiment, as shown in the drawing, the fourth portion 25a4 has a planar surface 29 that extends parallel to the second side surface 10f and faces the second side surface 10f. Similarly to the third portion 25a3, the planar surface 29 may occupy the entire or a part of the surface of the fourth portion 25a4 that faces the second side surface 10f. The surface of the fourth portion 25a4 facing the second side surface 10f may be a composite surface in which the planar surface 29 and the curved surface are connected. In one embodiment, the surface of the fourth portion 25a4 facing the second side surface 10f may be a curved surface that curves convexly toward the second side surface 10f.

In one embodiment, the radius of curvature of the first portion 25a1 is smaller than the radius of curvature of the third portion 25a3 and the fourth portion 25a4. In a more specific embodiment, the curvature radius of the curved surface 26 of the first portion 25a1 is smaller than the curvature radius of the surface of the third portion 25a3 that faces the first side surface 10e and the radius of curvature of the surface of the fourth portion 25a4 that faces the second side surface 10f. In one embodiment, the radius of curvature of the second portion 25a2 is smaller than the radius of curvature of the third portion 25a3 and the fourth portion 25a4. In a more specific embodiment, the curvature radius of the curved surface 27 of the second portion 25a2 is smaller than the curvature radius of the surface of the third portion 25a3 that faces the first side surface 10e and the radius of curvature of the surface of the fourth portion 25a4 that faces the second side surface 10f. When the radius of curvature of the first portion 25a1 is not constant, the average of the curvature radii at each of a plurality of points (for example, three or five points) evenly distributed around the coil axis Ax in the first portion 25a1 may be defined as the radius of curvature of the first portion 25a1, or the maximum value among the curvature radii of the first portion 25a1 may be defined as the radius of curvature of the first portion 25a1. When the radii of curvature of the second portion 25a2, the third portion 25a3, and the fourth portion 25a4 are not constant, the radius of curvature of the second portion 25a2, the third portion 25a3 and the fourth portion 25a4 can be respectively determined in the same manner as the above case where the radius of curvature of the first portion 25a1 is not constant.

In one embodiment, the first portion 25a1 includes an intersection P1 of a perpendicular line drawn from the coil axis Ax to the first end surface 10c and the outermost turn of the winding portion 25a. In one embodiment, the second portion 25a2 includes an intersection P2 of a perpendicular line drawn from the coil axis Ax to the second end surface 10d and the outermost turn of the winding portion 25a. In one embodiment, the third portion 25a3 includes an intersection P3 of a perpendicular line drawn from the coil axis Ax to the first side surface 10e and the outermost turn of the winding portion 25a. In one embodiment, the fourth portion 25a4 includes an intersection P4 of a perpendicular line drawn from the coil axis Ax to the second side surface 10f and the outermost turn of the winding portion 25a.

Boundaries between adjacent portions of the first portion 25a1, the second portion 25a2, the third portion 25a3, and the fourth portion 25a4 can be defined, for example, as follows. When viewed from the direction of the coil axis Ax, virtual lines connecting the coil axis Ax and the four corners of the base body 10 are drawn, and these four virtual lines may be defined as the boundary lines between the adjacent portions of the first portion 25a1, the second portion 25a2, the third portion 25a3, and the fourth portion 25a4. For example, a virtual line connecting the upper left corner of the base body 10 with the coil axis Ax from the viewpoint of FIG. 2 may be defined as the boundary line between the first portion 25a1 and the fourth portion 25a4. Similarly, from the viewpoint of FIG. 2, virtual lines connecting between the upper right corner, the lower right corner, and the lower left corner of the base body 10 with the coil axis Ax may be defined as the boundary line between the fourth portion 25a4 and the second portion 25a2, the boundary line between the second portion 25a2 and the third portion 25a3, and the boundary line between the third portion 25a3 and the first portion 25a1, respectively.

In one embodiment, a first end margin E1 representing the distance between the first portion 25a1 of the winding portion 25a and the first end surface 10c of the base body 10 is larger than a first side margin S1 representing the distance the distance between the third portion 25a3 of the winding portion 25a and the first side surface 10e of the base body 10, and a second side margin S2 representing the distance between the fourth portion 25a4 of the winding portion 25a and the second side surface 10f of the base body 10. In one embodiment, a second end margin E2 representing the distance between the second portion 25a2 of the winding portion 25a and the second end surface 10d of the base body 10 is larger than any of the first side margin S1 and the second side margin S2. In one embodiment, the end margin E1 and the end margin E2 are both in the range of 1.5 to 10 times the side margin S1 and the side margin S2.

In one embodiment, the first end margin E1 and the second end margin E2 may be the same or substantially the same. When a difference between the first end margin E1 and the second end margin E2 is 10% or less of the first end margin E1, it can be considered that the first end margin E1 and the second end margin E2 are substantially the same.

In one embodiment, the first side margin S1 and the second side margin S2 may be the same or substantially the same. When a difference between the first side margin S1 and the second side margin S2 is 10% or less of the first side margin S1, it can be considered that the first side margin S1 and the second side margin S2 are substantially the same.

As shown, in one embodiment, the lead-out portion 25b1 extends along the coil axis Ax. In one embodiment, the lead-out portion 25b2 extends along the coil axis Ax. If the area occupied by the lead-out portion in the cross section perpendicular to the coil axis Ax becomes too large, the inductance of the coil component 1 may deteriorate because the lead-out portion obstructs the passage of magnetic flux.

According to the illustrated embodiment, since one end of the winding portion 25a and the external electrode 21 are coupled to each other via the lead-out portion 25b1 extending along the coil axis Ax, it is possible to prevent degradation of inductance due to the lead-out portion that connects the one end of the winding portion 25a and the external electrode 21. Further, according to the illustrated embodiment, since the other end of the winding portion 25a and the external electrode 22 are coupled to each other via the lead-out portion 25b2 extending along the coil axis Ax, it is possible to prevent degradation of inductance due to the lead-out portion that connects the other end of the winding portion 25a and the external electrode 22.

In one embodiment, the ratio of the area of the winding portion 25a to the area of the first principal surface 10a viewed from the direction of the coil axis Ax is 0.3 or more. When the shape of the first principal surface 10a viewed from the direction of the coil axis Ax is rectangular, the dimension in the L-axis direction is L1 and the dimension in the W-axis direction is W1, so that the area S1 of the first principal surface 10a is represented as S1=L1×W1. When the area of the winding portion 25a viewed from the direction of the coil axis Ax is S2, S2/S1 is 0.3 or more in one embodiment. There is a demand for coil components that allow a large current to run therethrough while keeping the coil components small in their external dimensions. In order to realize such a coil component, the sectional area of its coil conductor is likely to be increased. As the sectional area of the coil conductor is increased, the area S2 of the winding portion 25a viewed from the direction of the coil axis Ax is also increased. In particular, when S2 is increased as much as S2/S1 becomes 0.3 or more and if the side margin and the end margin are the same, a sufficient area through which the magnetic flux passes cannot be secured, and the inductance may be deteriorated. Thus, when S2/S1 is 0.3 or more, it is effective to optimize the ratio of the side margin to the end margin and design the coil conductor such that a sufficient area for the magnetic flux is secured. When S2/S1 is less than 0.3, a sufficient area through which the magnetic flux passes is secured even if the side margin and the end margin are the same. Therefore the inductance will not be deteriorated so much that it will not become a practical problem.

An example of manufacturing method of the coil component 1 according to one embodiment of the invention will now be described. The following describes an example of the manufacturing method of the coil component 1 using a compression molding process. To begin with, metal magnetic particles are prepared. An insulating film may be provided on surfaces of the metal magnetic particles as necessary. The metal magnetic particles may be a particle mixture obtained by mixing together two types of metal magnetic particles having different average particle sizes. The prepared metal magnetic particles, a resin material, and a diluting solvent are then mixed to prepare a composite magnetic material. Subsequently, the coil conductor 25 prepared in advance is placed in a molding die, and a molding pressure is applied thereto at a temperature of, for example, 50 to 150° C., and then further heated 150 to 400° C. for curing. In this way, the magnetic base body 10 including the coil conductor 25 thereinside can be obtained. The coil conductor 25 is configured and arranged such that the first end margin E1 and the second end margin E2 are larger than any of the first side margin S1 and the second side margin S2 when viewed from the direction of the coil axis Ax.

The heat treatment for obtaining the magnetic base body 10 may be performed in two steps as described above or in one step. When the heat treatment is performed in one step, molding and curing are performed during the heat treatment. In the base body 10, the resin contained in the composite magnetic material is cured and serves as the binder. The base body 10 may be warm molded at a temperature of, for example, around 80° C. The molding pressure for molding is, for example, 50 to 200 MPa. The molding pressure can be appropriately adjusted to obtain a desired filling factor. The molding pressure is, for example, 100 MPa.

Next, a conductor paste is applied to a surface of the magnetic base body 10, which is produced in the above-described manner, to form the external electrodes 21 and 22. The external electrode 21 is electrically connected to one end of the coil conductor 25 inside the magnetic base body 10, and the external electrode 22 is electrically connected to the other end of the coil conductor 25 inside the magnetic base body 10. The coil component 1 is obtained, as described above.

The coil component 1 manufactured is mounted on the mount substrate 2 by a reflow process. In this process, the mount substrate having the coil component 1 provided thereon passes at a high speed through a reflow furnace heated to, for example, a peak temperature of 260° C., and then the external electrodes 21, 22 are soldered to the corresponding land portions 3 of the mount substrate. In this way, the coil component 1 is mounted on the mount substrate, and thus the circuit board is manufactured.

Next, a description is given of inductor characteristics of the coil component 1 in one embodiment. For a simulation of inductor characteristics, four evaluation models (evaluation models #1 to #4) were created. Each of the valuation models #1 to #4 is a model of the coil component 1. Each of the evaluation models #1 to #4 has a rectangular parallelepiped base body corresponding to the base body 10, a conductor corresponding to the coil conductor 25, and two electrodes corresponding to the external electrodes 21 and 22. The length dimension (dimension in the L-axis direction) of the base body was 2.0 mm, the width dimension (dimension in the W-axis direction) was 1.2 mm, and the height dimension (dimension in the T-axis direction) was 1.2 mm. In each evaluation model, the conductor corresponding to the coil conductor 25 is wound around a coil axis corresponding to the coil axis Ax by 10.5 turns. In the evaluation model #1, the distance from the conductor to the surface of the base body when viewed from the direction of the coil axis was set to 0.25 mm. That is, in the evaluation model #1, both the end margin and the side margin were set to 0.25 mm. In each evaluation model, when the end margin and the side margin are equal to each other, the end margin (or the side margin) is referred to as a reference margin. In the evaluation models #2 to #4, the reference margins were set to 0.2 mm, 0.15 mm, and 0.1 mm, respectively.

Figure 3:
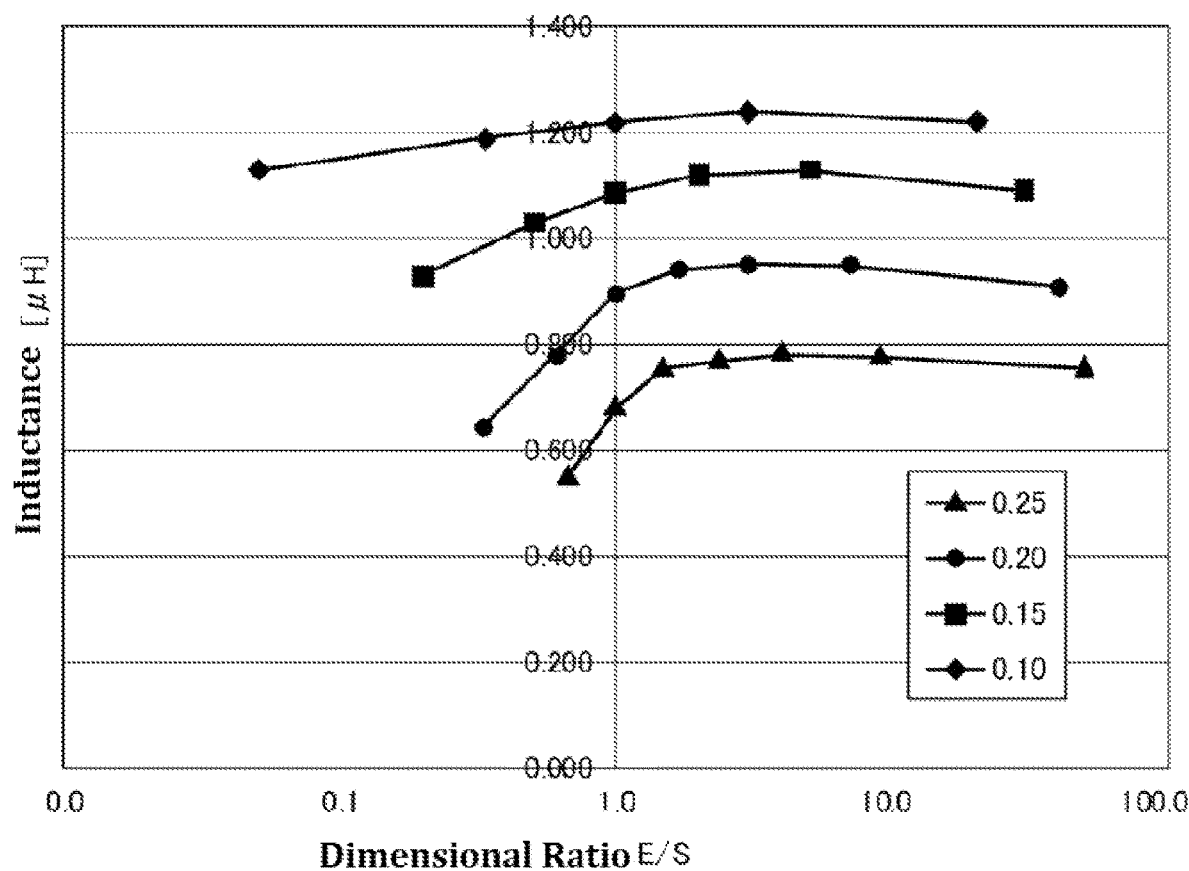
FIG. 3 is a graph showing a relationship between a ratio of an end margin E to a side margin S and an inductance calculated by simulation.

For each of the evaluation models #1 to #4 configured as described above, the end margin and the side margin are increased or reduced by 0.05 mm while maintaining the total of the end margin and the side margin at a constant value (twice the reference margin). The inductance L after changing the end margin and the side margin in this way was calculated by simulation. The simulation results are shown in FIG. 3. FIG. 3 is a graph showing the simulation results of the inductance L of the evaluation models #1 to #4. The horizontal axis shows the ratio of the end margin E to the side margin S on a logarithmic scale, and the vertical axis shows the calculated inductance. In FIG. 3, for the evaluation model #1 in which the reference margin was set to 0.25 mm, the simulation result of the inductance when the end margin and the reference margin were equal is plotted at the origin (E/S=1) of the X axis. To the right of the plot at the origin, the inductance resulted from a simulation in which the end margin is increased by 0.05 from the reference margin to 0.30 mm, and the side margin is reduced from the reference margin by 0.05 to 0.20 mm is plotted at X=1.5 (=0.3/0.2) on the X axis. Other simulation results were calculated in the same manner, and the calculated simulation results are plotted in the graph of FIG. 3. When the end margin or the side margin becomes zero by subtracting 0.05 mm, 0.01 was used instead of zero for convenience of calculation.

As shown in the figure, in any case where the reference margin was 0.10 to 0.25 mm, it was found that the inductance was improved by increasing the dimension corresponding to the end margin relative to the side margin.

Next, a coil component 101 relating to another embodiment of the present invention will be described with reference to FIGS. 4 and 5. The coil component 101 is different from the coil component 1 in that it includes a coil conductor wound in a spiral pattern unlike the coil conductor 25a wound a plurality of turns in a plane.

Figure 4:
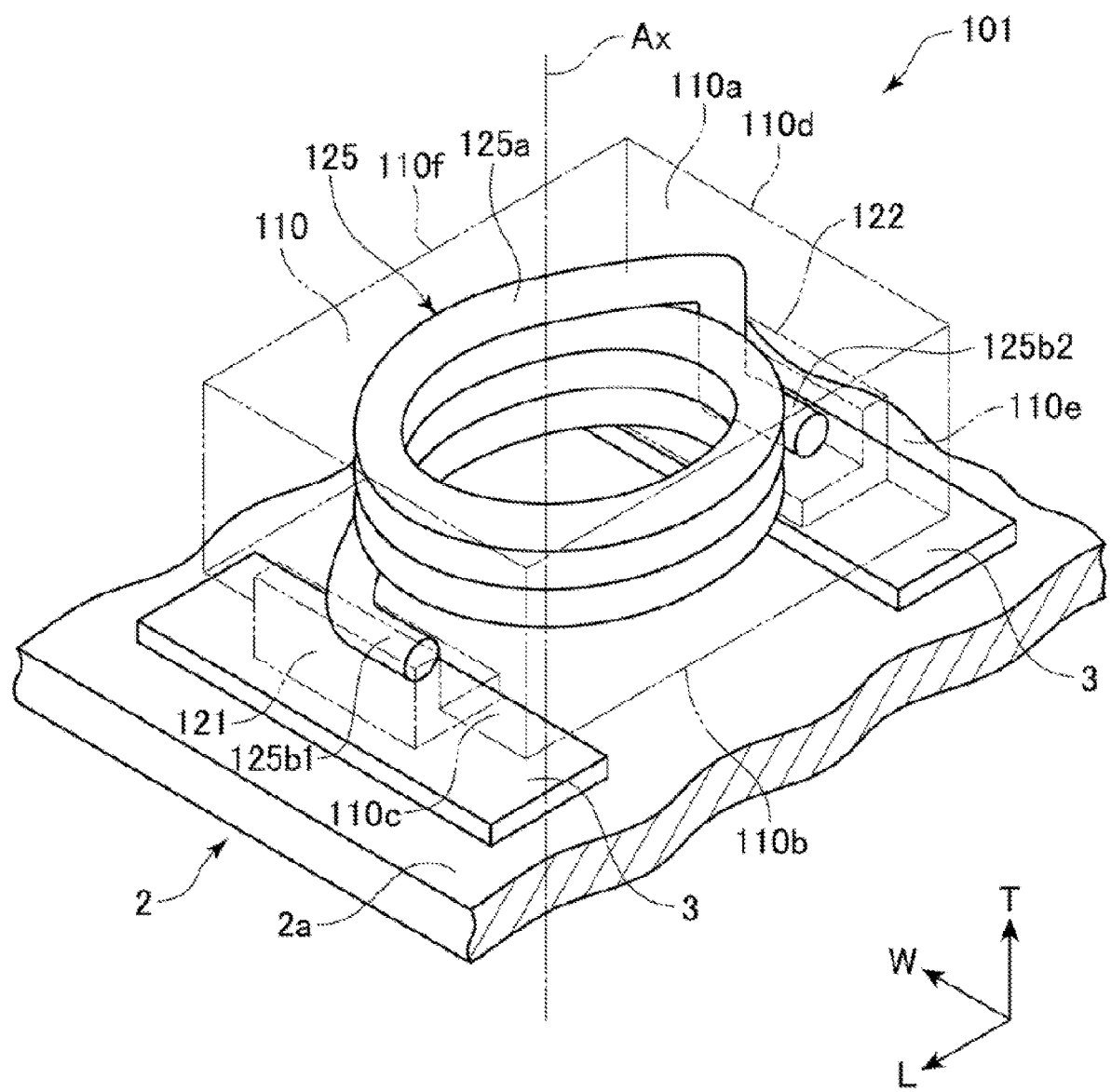
FIG. 4 is a perspective view schematically showing a coil component according to another embodiment of the invention.
Figure 5:
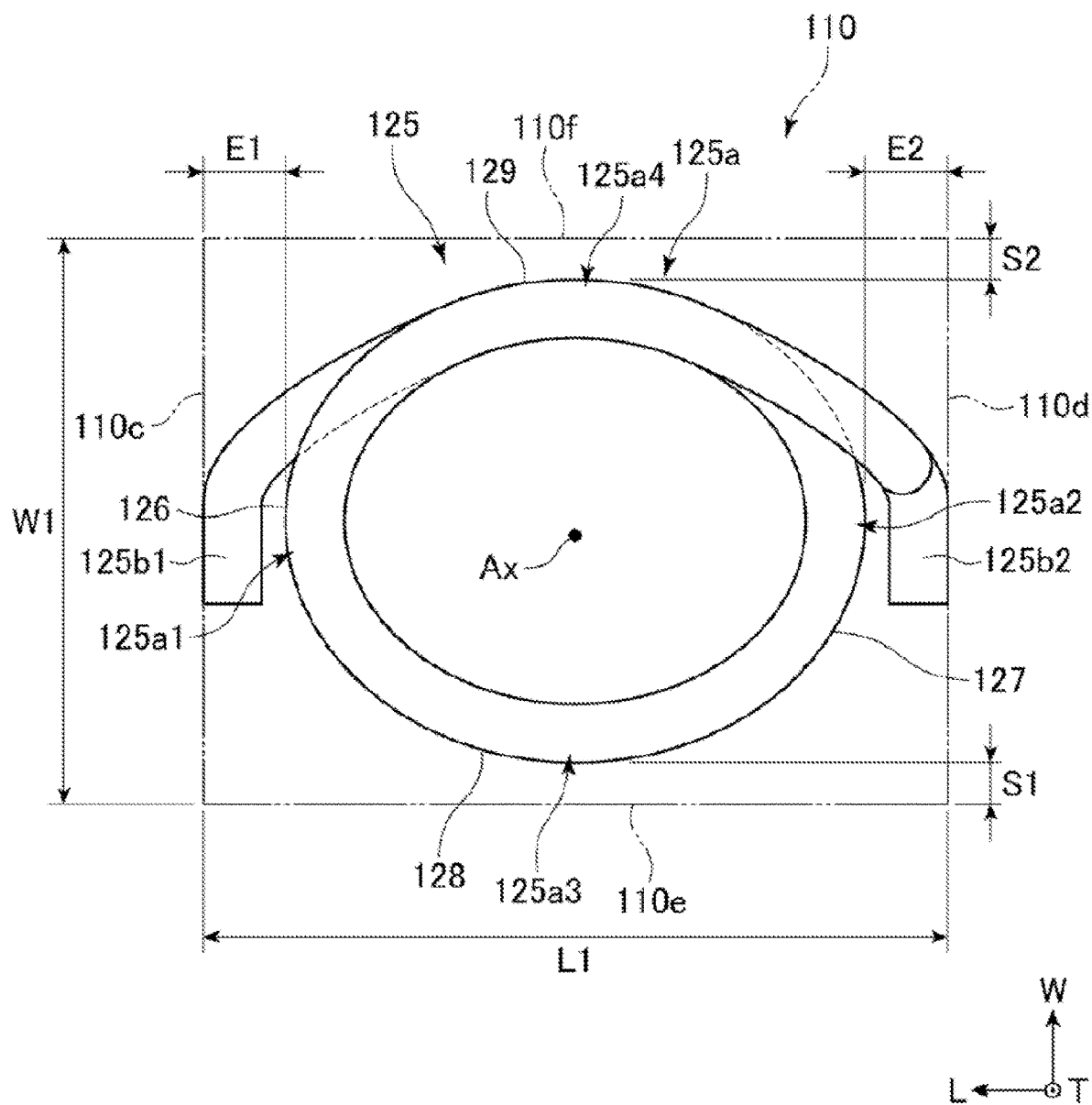
FIG. 5 is a schematic plan view of the coil component shown in FIG. 4.

As shown in FIGS. 4 and 5, the coil component 101 includes a coil conductor 125 provided in a magnetic base body 110, an external electrode 121 provided on the magnetic base body 110, and an external electrode 122 provided on the surface of the magnetic base body 110 at a position spaced apart from the external electrode 121. The magnetic base body 110 is made of a magnetic material similarly to the magnetic base body 10.

The coil component 101 may be mounted on a mount substrate 2a. The mount substrate 2a has two land portions 3 provided thereon. The coil component 101 is mounted on the mount substrate 2a by bonding the external electrodes 121, 122 to the corresponding land portions 3 of the mount substrate 2a. The circuit board 2 is configured by mounting the coil component 101 on the mount substrate 2a. The circuit board 2 according to one embodiment includes the coil component 101 and the mount substrate 2a on which the coil component 101 is mounted. The circuit board 2 may include any electronic components in addition to the coil component 101.

The magnetic base body 110 has a substantially rectangular parallelepiped shape. The magnetic base body 110 has a first principal surface 110a, a second principal surface 110b, a first end surface 110c, a second end surface 110d, a first side surface 110e, and a second side surface 110f. The outer surface of the magnetic base body 110 is defined by these six surfaces. The first principal surface 110a and the second principal surface 110b are at the opposite ends in the height direction, the first end surface 110c and the second end surface 110d are at the opposite ends in the length direction, and the first side surface 110e and the second side surface 110f are at the opposite ends in the width direction. The description of the magnetic base body 10 also applies to the magnetic base body 110 where it is possible.

The coil conductor 125 includes a winding portion 125a wound around the coil axis Ax extending along the thickness direction (T-axis direction), a lead-out portion 125b1 that connects one end of the winding portion 125a to the external electrode 121, and a lead-out portion 125b2 that connects the other end of the winding portion 125a to the external electrode 122.

Similarly to the winding portion 25a, the winding portion 125a includes a first portion 125a1 facing the first end surface 110c, a second portion 125a2 facing the second end surface 110d, a third portion 125a3 facing the first side surface 110e, and a fourth portion 125a4 facing the second side surface 110f. In the illustrated embodiment, the fourth portion 125a4 in a first turn of the winding counted from the lead-out portion 125b1 extends clockwise from one end to the other end of the fourth portion, and is connected to the lead-out portion 125b1 at its one end. The second portion 125a2 in the first turn of the winding extends clockwise from one end to the other end of the second portion, and its one end is connected to the other end of the fourth portion 125a4 in the first turn. The third portion 125a3 in the first turn of the winding extends clockwise from one end to the other end of the third portion, and its one end is connected to the other end of the second portion 125a2 in the first turn. The third portion 125a1 in the first turn of the winding extends clockwise from one end to the other end of the first portion, and its one end is connected to the other end of the third portion 125a3 in the first turn. The third portion 125a3 in the second turn of the winding extends clockwise from one end to the other end of the third portion, and its one end is connected to the other end of the first portion 125a1 in the first turn. In the same manner, the winding portion 125a extends and is wound until its end is connected to the lead-out portion 125b2. As described above, the third portion 125a3 and the fourth portion 125a4 connect the first portion 125a1 and the second portion 125a2, respectively. Boundaries between adjacent portions of the first portion 125a1, the second portion 125a2, the third portion 125a3, and the fourth portion 125a4 can be defined, for example, in the same manner as the portions of the winding portion 25a. For example, when viewed from the direction of the coil axis Ax, virtual lines connecting the coil axis Ax and the four corners of the base body 110 are drawn, and these four virtual lines may be defined as the boundary lines between the adjacent portions of the first portion 125a1, the second portion 125a2, the third portion 125a3, and the fourth portion 125a4.

In one embodiment, as shown in the drawing, the first portion 125a1 has a curved surface 126 that is convexly curved toward the first end surface 110c and faces the first end surface 110c. In one embodiment, as shown in the drawing, the second portion 125a2 has a curved surface 127 that is convexly curved toward the second end surface 110d and faces the second end surface 110d. In one embodiment, as shown in the drawing, the third portion 125a3 has a curved surface 128 that is convexly curved toward the first side surface 110e and faces the first side surface 110e. In one embodiment, as shown in the drawing, the fourth portion 125a4 has a curved surface 129 that is convexly curved toward the second side surface 110f and faces the second side surface 110f.

In one embodiment, the radius of curvature of the first portion 125a1 is smaller than the radius of curvature of any of the third portion 125a3 and the fourth portion 125a4. In a more specific embodiment, the curvature radius of the curved surface 126 of the first portion 125a1 is smaller than the curvature radius of the curved surface 128 of the third portion 125a3 and the radius of curvature of the curved surface 129 of the fourth portion 125a4. In one embodiment, the radius of curvature of the second portion 125a2 is smaller than the radius of curvature of any of the third portion 125a3 and the fourth portion 125a4. In a more specific embodiment, the curvature radius of the curved surface 127 of the second portion 125a2 is smaller than the curvature radius of the curved surface 128 of the third portion 125a3 and the radius of curvature of the curved surface 129 of the fourth portion 125a4. When the radius of curvature of the first portion 125a1 is not constant, the average of the curvature radii at each of a plurality of points (for example, three or five points) evenly distributed around the coil axis Ax in the first portion 125a1 may be defined as the radius of curvature of the first portion 125a1, or the maximum value among the curvature radii of the first portion 125a1 may be defined as the radius of curvature of the first portion 125a1. When the radii of curvature of the second portion 125a2, the third portion 125a3, and the fourth portion 125a4 are not constant, the radius of curvature of the second portion 125a2, the third portion 125a3 and the fourth portion 125a4 can be respectively determined in the same manner as the above case where the radius of curvature of the first portion 125a1 is not constant.

The arrangement of the winding portion 125a in the base body 110 of the coil component 101 is the same as the arrangement of the winding portion 25a in the bas body 10 of the coil component 1 described above. In one embodiment, the first end margin E1 representing the distance between the first portion 125a1 of the winding portion 125a and the first end surface 110c of the base body 110 is larger than the first side margin S1 representing the distance the distance between the third portion 125a3 of the winding portion 125a and the first side surface 110e of the base body 110, and the second side margin S2 representing the distance between the fourth portion 125a4 of the winding portion 125a and the second side surface 110f of the base body 110. In one embodiment, the second end margin E2 representing the distance between the second portion 125a2 of the winding portion 125a and the second end surface 110d of the base body 110 is larger than any of the first side margin S1 and the second side margin S2.

The coil component 101 may be manufactured by a compression molding process in the same manner as the coil component 1. The coil component 101 manufactured is mounted on the mount substrate 2 by a reflow process. In this process, the mount substrate 2 having the coil component 101 provided thereon passes at a high speed through a reflow furnace heated to, for example, a peak temperature of 260° C., and then the external electrodes 121, 122 are soldered to the corresponding land portions 3 of the substrate 2. In this way, the coil component 101 is mounted on the mount substrate, and thus the circuit board 2 is manufactured.

Figure 6:
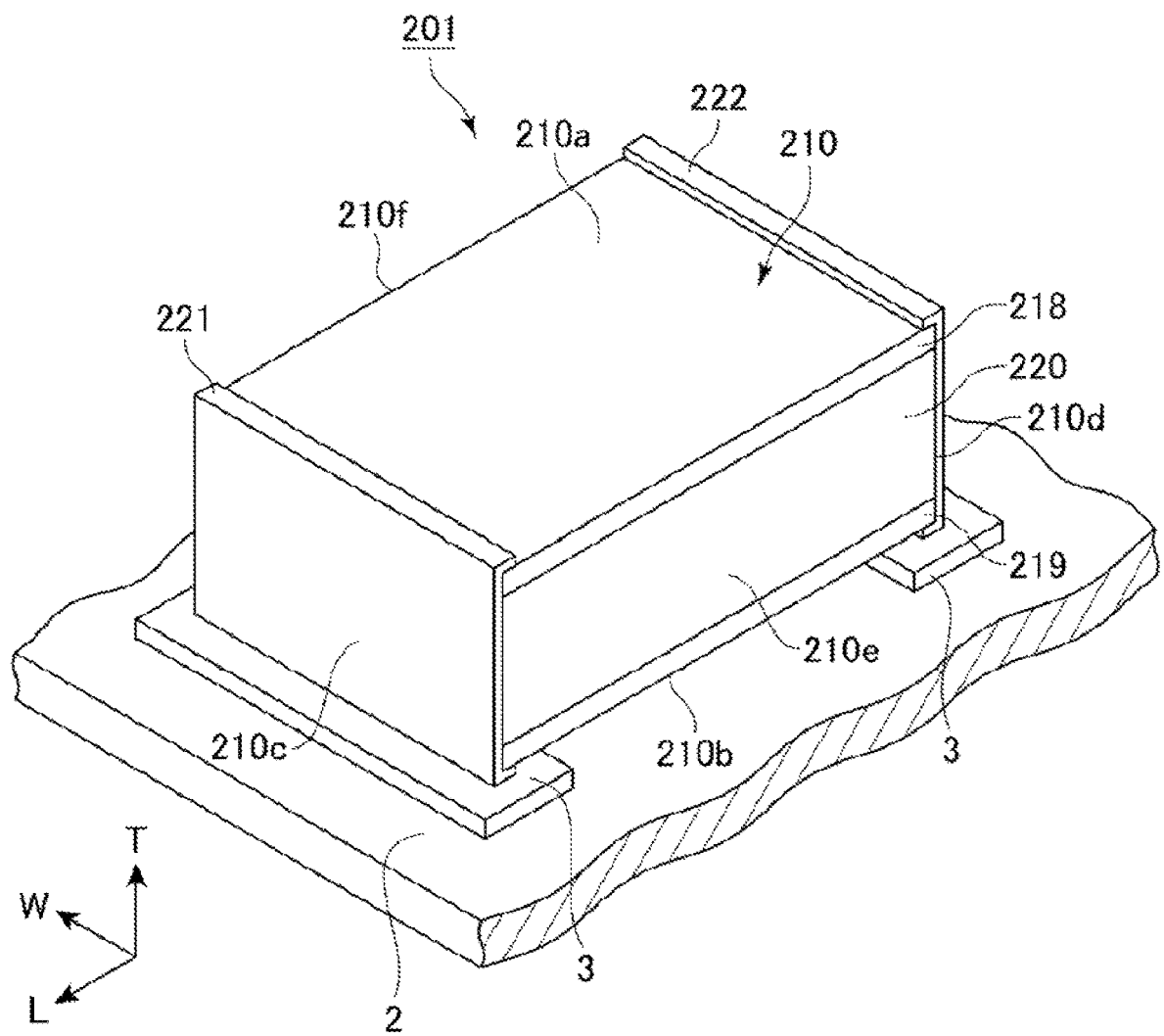
FIG. 6 is a perspective view schematically showing a coil component according to another embodiment of the invention.
Figure 7:
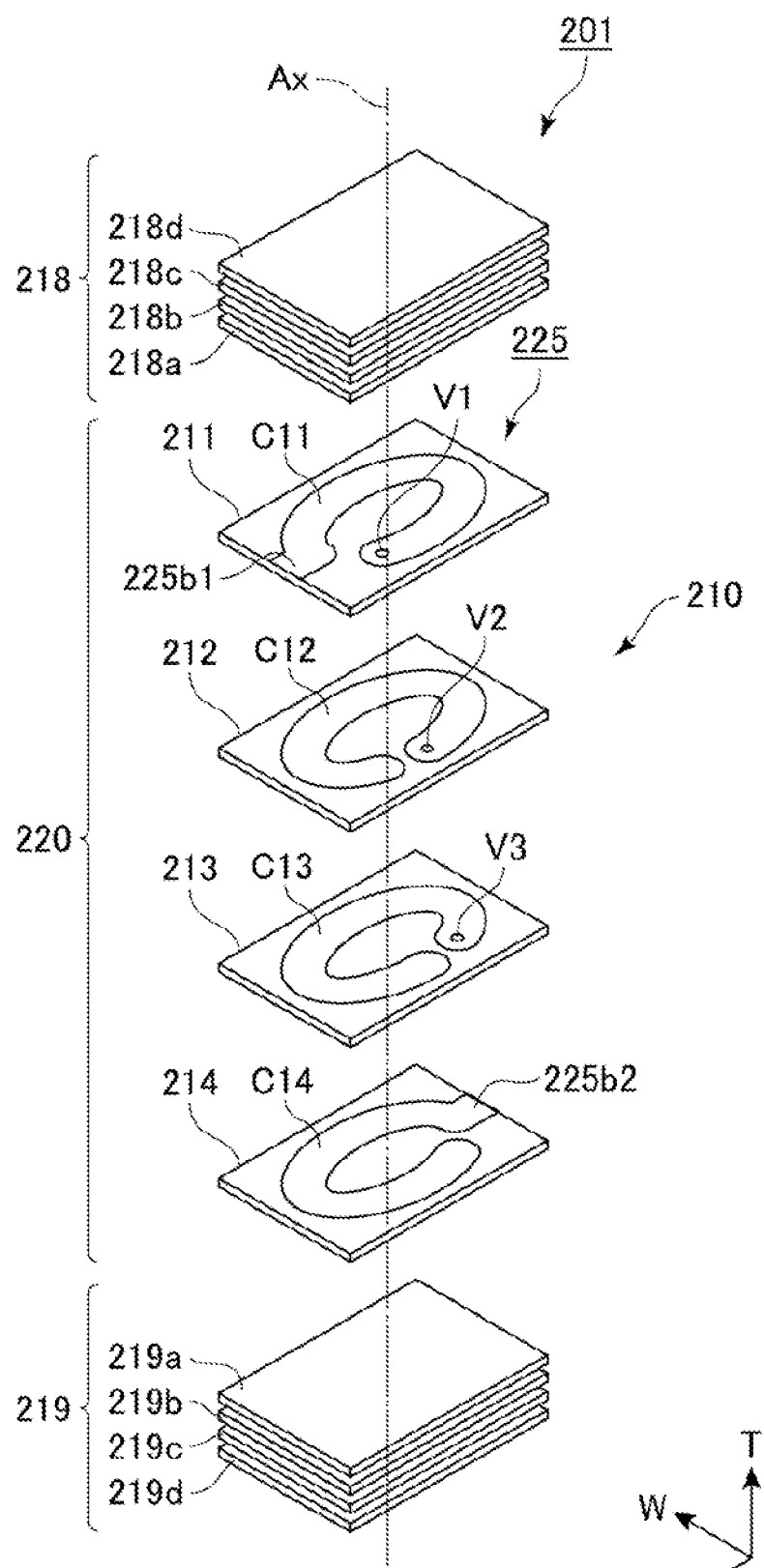
FIG. 7 is a perspective view schematically showing a coil component of FIG. 6.
Figure 8:
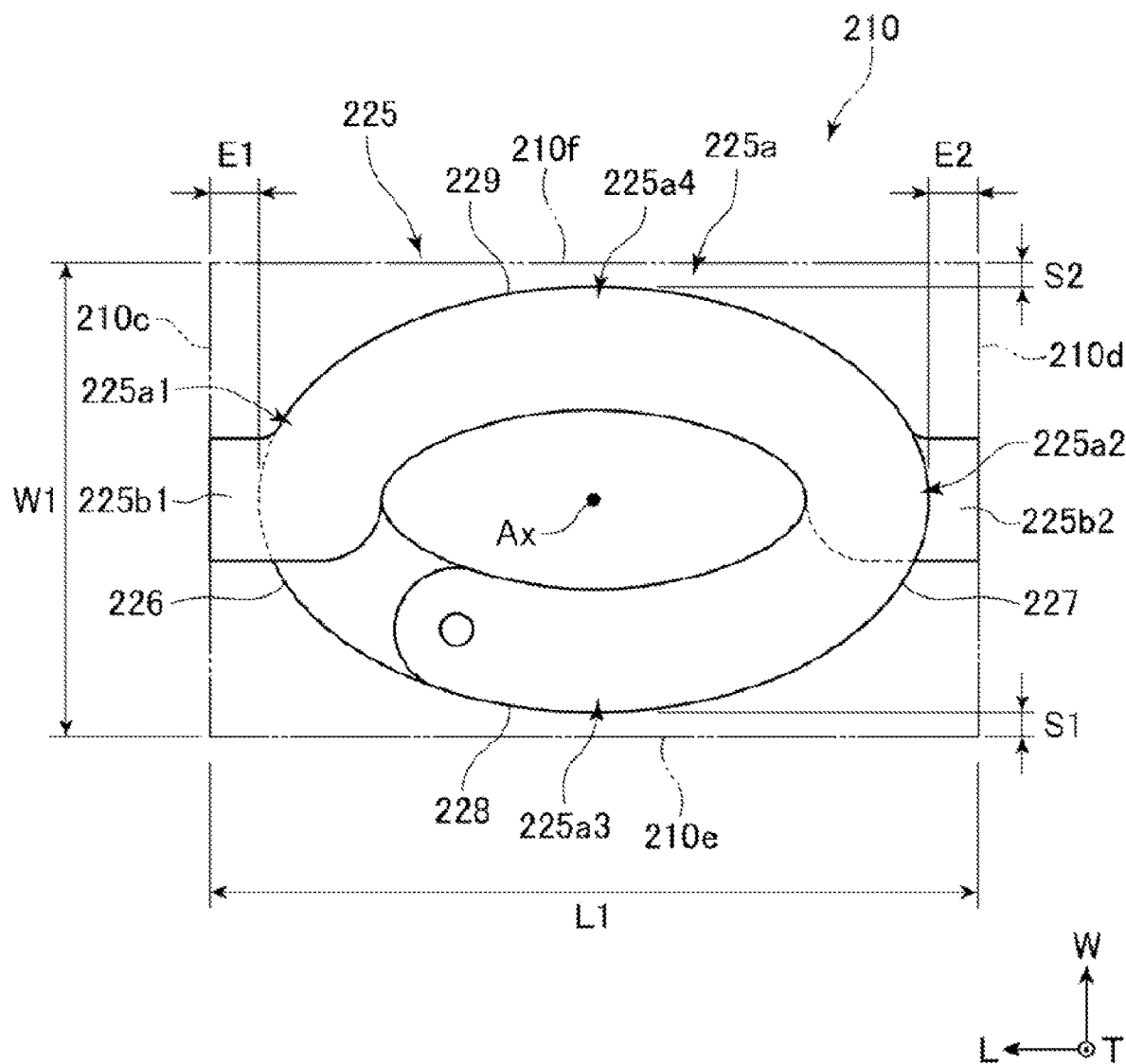
FIG. 8 is a schematic plan view of the coil component shown in FIG. 6.

Next, with reference to FIGS. 6 to 8, a description is given of a coil component 201 according to another embodiment of the present invention. The coil component 201 is a laminated coil. As shown, the coil component 201 includes a magnetic base body 210, a coil conductor 225 disposed in the magnetic base body 210, an external electrode 221 disposed on the magnetic base body 210, and an external electrode 222 disposed on the magnetic base body 210 at a position spaced apart from the external electrode 221. The magnetic base body 210 is made of a magnetic material similarly to the magnetic base body 10.

The magnetic base body 210 is formed of a magnetic material in a rectangular parallelepiped shape. The magnetic base body 210 includes a magnetic layer 220 having a coil 225 embedded therein, an upper cover layer 218 formed on the upper surface of the magnetic layer 220 and made of a magnetic material, and a lower cover layer 219 formed on the lower surface of the magnetic layer 220 and made of a magnetic material. The upper cover layer 218 includes magnetic films 218a to 218d made of a magnetic material, and the lower cover layer 219 includes magnetic films 219a to 219d made of a magnetic material. The boundary between the magnetic layer 220 and the upper cover layer 218 and the boundary between the magnetic layer 220 and the lower cover layer 219 may not be clearly identified depending on the manufacturing method used to fabricate the magnetic base body 10. The magnetic base body 210 is generally shaped as a rectangular parallelepiped and has a first principal surface 210a, a second principal surface 210b, a first end surface 210c, a second end surface 210d, a first side surface 210e, and a second side surface 210f. The outer surface of the magnetic base body 210 is defined by these six surfaces. The first principal surface 210a and the second principal surface 210b are at the opposite ends in the height direction, the first end surface 210c and the second end surface 210d are at the opposite ends in the length direction, and the first side surface 210e and the second side surface 210f are at the opposite ends in the width direction. The description of the magnetic base body 10 also applies to the magnetic base body 210 where it is possible.

The magnetic layer 220 includes magnetic films 211 to 214. In the magnetic layer 220, the magnetic films 211, 212, 213, and 214 are stacked in the stated order from the positive side to the negative side in the T-axis direction. On the respective upper surfaces of the magnetic films 211 to 214, conductor patterns C11 to C14 are formed. The conductor patterns C11 to C14 are formed by, for example, printing a conductive paste made of a highly conductive metal or alloy via screen printing. The conductive paste may be made of Ag, Pd, Cu, Al, or an alloy thereof.

The magnetic films 211 to 213 are provided with vias V1 to V3, respectively, at a predetermined position therein. The vias V1 to V3 are formed by forming a through-hole at the predetermined position in the magnetic films 211 to 213 so as to extend through the magnetic films 211 to 213 in the T axis direction and filling the through-holes with a conductive material. Each of the conductor patterns C11 to C14 is electrically connected to the respective adjacent conductor patterns through the vias V1 to V3. The conductor patterns C11 to C14 connected in this manner form the spiral coil conductor 225.

As shown in FIG. 7, the coil conductor 225 includes a winding portion 225a wound around the coil axis Ax extending along the thickness direction (T-axis direction), a lead-out portion 225b1 that connects one end of the winding portion 225a to the external electrode 221, and a lead-out portion 225b2 that connects the other end of the winding portion 225a to the external electrode 222.

Similarly to the winding portion 25a, the winding portion 225a includes a first portion 225a1 facing the first end surface 210c, a second portion 225a2 facing the second end surface 210d, a third portion 225a3 facing the first side surface 210e, and a fourth portion 225a4 facing the second side surface 210f. In the illustrated embodiment, the first portion 225a1 in a first turn of the winding extends clockwise from one end to the other end of the first portion, and is connected to the lead-out portion 225b1 at its one end. The fourth portion 225a4 in the first turn of the winding extends clockwise from one end to the other end of the fourth portion, and its one end is connected to the other end of the first portion 225a1 in the first turn. The second portion 225a2 in the first turn of the winding extends clockwise from one end to the other end of the second portion, and its one end is connected to the other end of the fourth portion 225a4 in the first turn. The third portion 225a3 in the first turn of the winding extends clockwise from one end to the other end of the third portion, and its one end is connected to the other end of the second portion 225a2. The first portion 225a1 in the second turn of the winding extends clockwise from one end to the other end of the first portion, and its one end is connected to the other end of the third portion 225a3 in the first turn. In the same manner, the winding portion 225a extends and is wound until its end is connected to the lead-out portion 225b2. As described above, the third portion 225a3 and the fourth portion 225a4 connect the first portion 225a1 and the second portion 225a2, respectively. Boundaries between adjacent portions of the first portion 225a1, the second portion 225a2, the third portion 225a3, and the fourth portion 225a4 can be defined, for example, in the same manner as the portions of the winding portion 25a. For example, when viewed from the direction of the coil axis Ax, virtual lines connecting the coil axis Ax and the four corners of the base body 210 are drawn, and these four virtual lines may be defined as the boundary lines between the adjacent portions of the first portion 225a1, the second portion 225a2, the third portion 225a3, and the fourth portion 225a4.

In one embodiment, as shown in the drawing, the first portion 225a1 has a curved surface 226 that is convexly curved toward the first end surface 210c and faces the first end surface 210c. In one embodiment, as shown in the drawing, the second portion 225a2 has a curved surface 227 that is convexly curved toward the second end surface 210d and faces the second end surface 210d. In one embodiment, as shown in the drawing, the third portion 225a3 has a curved surface 228 that is convexly curved toward the first side surface 210e and faces the first side surface 210e. In one embodiment, as shown in the drawing, the fourth portion 225a4 has a curved surface 229 that is convexly curved toward the second side surface 210f and faces the second side surface 210f.

In one embodiment, the radius of curvature of the first portion 225a1 is smaller than the radius of curvature of any of the third portion 225a3 and the fourth portion 225a4. In a more specific embodiment, the curvature radius of the curved surface 226 of the first portion 225a1 is smaller than the curvature radius of the curved surface 228 of the third portion 225a3 and the radius of curvature of the curved surface 229 of the fourth portion 225a4. In one embodiment, the radius of curvature of the second portion 225a2 is smaller than the radius of curvature of any of the third portion 225a3 and the fourth portion 225a4. In a more specific embodiment, the curvature radius of the curved surface 227 of the second portion 225a2 is smaller than the curvature radius of the curved surface 228 of the third portion 225a3 and the radius of curvature of the curved surface 229 of the fourth portion 225a4. When the radius of curvature of the first portion 225a1 is not constant, the average of the curvature radii at each of a plurality of points (for example, three or five points) evenly distributed around the coil axis Ax in the first portion 225a1 may be defined as the radius of curvature of the first portion 225a1, or the maximum value among the curvature radii of the first portion 225a1 may be defined as the radius of curvature of the first portion 225a1. When the radii of curvature of the second portion 225a2, the third portion 225a3, and the fourth portion 225a4 are not constant, the radius of curvature of the second portion 225a2, the third portion 225a3 and the fourth portion 225a4 can be respectively determined in the same manner as the above case where the radius of curvature of the first portion 225a1 is not constant.

The arrangement of the winding portion 225a in the base body 210 of the coil component 201 is the same as the arrangement of the winding portion 25a in the bas body 10 of the coil component 1 described above. For example, in one embodiment, the first end margin E1 representing the distance between the first portion 225a1 of the winding portion 225a and the first end surface 210c of the base body 210 is larger than the first side margin S1 representing the distance the distance between the third portion 225a3 of the winding portion 225a and the first side surface 210e of the base body 210, and the second side margin S2 representing the distance between the fourth portion 225a4 of the winding portion 225a and the second side surface 210f of the base body 210. In one embodiment, the second end margin E2 representing the distance between the second portion 225a2 of the winding portion 225a and the second end surface 210d of the base body 210 is larger than any of the first side margin S1 and the second side margin S2.

Next, a description is given of an example of a manufacturing method of the coil component 201. The coil component 201 can be produced by, for example, a lamination process. An example is hereinafter described of the production method of the coil component 201 using the lamination process.

To begin with, sheets of a magnetic material are formed, which are to be used as the magnetic films 218a to 218d constituting the upper cover layer 218, the magnetic films 211 to 214 constituting the magnetic layer 220, and the magnetic films 219a to 219d constituting the lower cover layer 219. These sheets of a magnetic material are made of a composite magnetic material containing a binder and a plurality of metal magnetic particles. The magnetic sheets for the coil component 201 can be produced in the same manner as the magnetic sheets used in the manufacturing process of the coil component 1.

The coil conductor is then provided in the sheets of the magnetic material. Specifically, a through-hole is formed in the respective sheets of the magnetic material, which are to be used as the magnetic films 211 to 213, at a predetermined position so as to extend through the sheets in the direction of the axis T. Following this, a conductive paste is printed by screen printing on the upper surface of each of the sheets of the magnetic material, which are to be used as the magnetic films 211 to 214, so that an unfired conductor pattern is formed on each sheet of the magnetic material. Also, the through-hole formed in each sheet of the magnetic material is filled with the conductive paste.

Subsequently, the sheets of the magnetic material, which serve as the magnetic films 211 to 214, are stacked to obtain a coil laminated body. The sheets of the magnetic material, which serve as the magnetic films 211 to 214, are stacked such that the conductor patterns C11 to C14 formed on the respective sheets of the magnetic material are each electrically connected to the adjacent conductor patterns through the vias V1 to V3.

Following this, a plurality of sheets of a magnetic material are stacked to form an upper laminated body, which is to be used as the upper cover layer 218. Similarly, a plurality of sheets of a magnetic material are stacked to form a lower laminated body, which is to be used as the lower cover layer 219.

Next, the lower laminated body, the coil laminated body, and the upper laminated body are stacked in the stated order in the direction of the T axis from the negative side to the positive side, and these stacked laminated bodies are bonded together by thermal compression using a pressing machine to produce a main laminated body. Instead of forming the lower, coil and upper laminated bodies, the main laminated body may be formed by sequentially stacking all of the sheets of the magnetic material prepared in advance and bonding the stacked sheets of the magnetic material collectively by thermal compression.

Next, the body laminate is diced to a desired size using a cutter such as a dicing machine or a laser processing machine to produce a chip laminate. Next, the chip laminate is subjected to degreasing, and the chip laminate thus degreased is heat-treated. The end portions of the chip laminate are polished by barrel-polishing or the like, if necessary.

Next, a conductive paste is applied to both end portions of the chip laminate to form the external electrodes 221 and 222. The coil component 201 is obtained, as described above.

Advantageous effects of the above embodiments will now be described. Conventional coil components are designed such that the end margin and the side margin are the same in order to magnetically effectively use each region of the substrate and to avoid concentration of magnetic flux in a specific region of the substrate. Further, in the conventional coil component, in order to prevent the winding portion of the coil conductor from being exposed from the substrate and to prevent a short circuit between the winding portion and external conductive members, a certain margin is provided between the winding portion and the end and side surfaces of the substrate. When the coil component is fabricated by the laminating process, a printed conductor pattern may deviate from the initial position, the positions of the magnetic sheets may be misaligned when laminating multiple magnetic sheets, and a position to dice may deviate when pieces are separated from each other in the manufacturing process. Since such deviations occur evenly in the length direction (L-axis direction) and the width direction (W-axis direction), in order to avoid defects caused by such deviation (for example, exposure of the winding portion), the margins provided between the winding portion and the surfaces of the base body are set to be the same in the length direction and the width direction. When the coil component is made by a compression molding process using a mold, it is required to have a certain distance between the wall of the mold in which the composite magnetic material is provided and the winding portion of the coil conductor inserted into the mold. The required distances between the wall of the mold and the winding portion are also set to be the same in the length direction and the width direction. As described above, the conventional coil components are designed such that the end margin and the side margin are the same or substantially the same. Whereas the coil conductor may have an oval or elliptical shape when viewed from the coil axis direction, which is a shape in which the dimension in one direction perpendicular to the coil conductor is larger than the dimension in the other direction perpendicular to the coil conductor. Thus the winding portion of the coil conductor may include a portion having a relatively small radius of curvature and a portion having a relatively large radius of curvature. When the current flowing through the coil conductor changes, the magnetic flux tends to concentrate around the portion having a relatively small radius of curvature rather than the portion having a relatively large radius of curvature. In one or more embodiments of the invention, the winding portions 25a, 125a, 225a include the first portions 25a1, 125a1, 225a1 and the second portions 25a2, 125a2, 225a2 respectively that have relatively small radii of curvature, and the third portions 25a3, 125a3, 225a3 and the fourth portions 25a4, 125a4, 225a4, respectively that have relatively large radii of curvature. Therefore, in the base bodies 10, 110, 210, magnetic flux tends to concentrate in the region between the first portions 25a1, 125a1, 225a1 and the first end surfaces 10c, 110c, 210c respectively, and the region between the second portions 25a2, 125a2, 225a2 and the second end surfaces 10d, 110d, 210d, respectively.

In one or more embodiments of the invention, the end margin E1, which is the distance between the first portions 25a1, 125a1, 225a1 of the winding portions 25a, 125a, 225a and the first end surfaces 10c, 110c, 210c, is larger than the side margin S1, which is the distance between the third portions 25a3, 125a3, 225a3 and the first side surfaces 10e, 110e, 210e, and the side margin S2, which is the distance from the fourth portions 25a4, 125a4, 225a4. Therefore it is possible to prevent concentration of magnetic flux in the region between the first portions 25a1, 125a1, 225a1 having a relatively small radius of curvature in the winding portions 25a, 125a, 225a and the surfaces of the base bodies 10, 110 and 210. Further, in one or more embodiments of the invention, the end margin E2, which is the distance between the second portions 25a2, 125a2, 225a2 of the winding portions 25a, 125a, 225a and the second end surfaces 10d, 110d, 210d, is larger than the side margin S1 and the side margin S2. Therefore it is possible to prevent concentration of magnetic flux in the region between the second portions 25a2, 125a2, 225a2 having a relatively small radius of curvature in the winding portions 25a, 125a, 225a and the surfaces of the base bodies 10, 110, 210.

Further, in one or more embodiments of the invention, the side margins S1 and S2 are smaller than the end margins E1 and E2 so that the external dimensions of the base body are smaller than those of the conventional coil component in which the side margin and the end margin are equal. In other words, the end margin E1 that contributes to the area of the region between the first portion 25a1, 125a1, 225a1 and the first end surfaces 10c, 110c, 210c, and the end margin E2 that contributes to the area of the region between the second portions 25a2, 125a2, 225a2 and the second end surfaces 10d, 110d, 210d, where the magnetic flux tends to concentrate, are selectively increased in order to prevent degradation of inductance without increasing the width direction size of the base body 10.

As described above, according to one or more embodiments of the invention, by making the end margins E1 and E2 larger than the side margins S1 and S2, it is possible to prevent concentration of magnetic flux in the region between the first portions 25a1, 125a1, 225a1 and the first end surfaces 10c, 110c, 210c and the region between the second portions 25a2, 125a2, 225a2 and the second end surfaces 10d, 110d, 210d, thus it is possible to prevent degradation of inductance while reducing the external dimensions of the base bodies 10, 110, 210. As discussed above, according to the one or more embodiments, it is possible to provide the coil components 1, 101, 201 having a reduced size while preventing degradation of inductance.

The dimensions, materials, and arrangements of the constituent elements described for the above various embodiments are not limited to those explicitly described for the embodiments, and these constituent elements can be modified to have any dimensions, materials, and arrangements within the scope of the present invention. Furthermore, constituent elements not explicitly described herein can also be added to the above-described embodiments, and it is also possible to omit some of the constituent elements described for the embodiments.

What is claimed is:

1. A coil component comprising:
a base body made of a magnetic material and having a first surface that extends in a first direction and a second direction orthogonal to the first direction and has a first dimension in the first direction larger than a second dimension in the second direction, a second surface that faces the first surface, a third surface that connects an end of the first surface in the first direction and an end of the second surface in the first direction, a fourth surface that faces the third surface, a fifth surface that connects the third surface and the fourth surface, and a sixth surface that faces the fifth surface;
a coil conductor having a winding portion that extends around a coil axis intersecting the first surface and the second surface;
a first external electrode disposed on the base body and connected to one end of the coil conductor; and
a second external electrode disposed on the base body and connected to the other end of the coil conductor,
wherein when viewed from a direction of the coil axis, the winding portion includes a first portion that faces the third surface and is curved toward the third surface, a second portion that faces the fourth surface and is curved toward the fourth surface, a third portion that connects the first portion and the second portion and faces the fifth surface, and a fourth portion that connects the first portion and the second portion and faces the sixth surface,
wherein radii of curvature of the first portion and the second portion are both smaller than radii of curvature of the third portion and the fourth portion, and
wherein when viewed from the direction of the coil axis, a distance between the first portion and the third surface and a distance between the second portion and the fourth surface are both larger than a distance between the third portion and the fifth surface and a distance between the fourth portion and the sixth surface.

2. The coil component of claim 1, wherein the distance between the first portion and the third surface and the distance between the second portion and the fourth surface are both in a range of 1.5 to 10 times the distance between the third portion and the fifth surface and the distance between the fourth portion and the sixth surface.

3. The coil component of claim 1, wherein when viewed from the direction of the coil axis, the distance between the first portion of the winding portion and the third surface is substantially same as the distance between the second portion of the winding portion and the fourth surface.

4. The coil component of claim 1, wherein when viewed from the direction of the coil axis, the distance between the third portion of the winding portion and the fifth surface is substantially same as the distance between the fourth portion of the winding portion and the sixth surface.

5. The coil component of claim 1, wherein the winding portion has a uniform cross-sectional area.

6. The coil component of claim 1, wherein the first external electrode is connected to one end of the winding portion via a first lead-out portion extending along the coil axis.

7. The coil component of claim 1, wherein the second external electrode is connected to the other end of the winding portion via a second lead-out portion extending along the coil axis.

8. The coil component of claim 1, wherein a proportion of an area of the winding portion to an area of the first surface when viewed from the direction of the coil axis is 0.3 or more.

9. A DC-to-DC converter, comprising the coil component of claim 1.

10. A circuit board comprising:
the coil component of claim 1, and a mount substrate soldered to the first and second external electrodes.

11. An electronic device comprising the circuit board of claim 10.

* * * * *